US008290177B2

(12) United States Patent
Jeong et al.

(10) Patent No.: US 8,290,177 B2
(45) Date of Patent: Oct. 16, 2012

(54) SOUND ZOOM METHOD, MEDIUM, AND APPARATUS

(75) Inventors: So-young Jeong, Seoul (KR); Kwang-cheol Oh, Yongin-si (KR); Jae-hoon Jeong, Yongin-si (KR); Kyu-hong Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1262 days.

(21) Appl. No.: 12/010,087

(22) Filed: Jan. 18, 2008

(65) Prior Publication Data

US 2009/0060222 A1 Mar. 5, 2009

(30) Foreign Application Priority Data

Sep. 5, 2007 (KR) ........................ 10-2007-0089960

(51) Int. Cl.
*H04R 3/00* (2006.01)
*H04R 25/00* (2006.01)
*H03G 3/00* (2006.01)

(52) U.S. Cl. ........... 381/92; 381/107; 381/104; 381/313

(58) Field of Classification Search .................... 382/92; 381/92, 107, 104, 106, 56, 313; 348/231.4, 348/348, 222.1, 240.99
See application file for complete search history.

(56) References Cited

U.S. PATENT DOCUMENTS

| | | | | |
|---|---|---|---|---|
| 4,862,278 | A | | 8/1989 | Dann et al. |
| 4,984,087 | A | | 1/1991 | Fujimura et al. |
| 5,121,426 | A | * | 6/1992 | Baumhauer et al. ...... 379/420.03 |
| 5,477,270 | A | | 12/1995 | Park |
| 5,793,875 | A | * | 8/1998 | Lehr et al. ...................... 381/313 |
| 6,931,138 | B2 | | 8/2005 | Kawamura et al. |
| 2003/0035549 | A1 | * | 2/2003 | Bizjak et al. .................... 381/56 |
| 2003/0151678 | A1 | | 8/2003 | Lee et al. |
| 2005/0099511 | A1 | | 5/2005 | Cazier |

FOREIGN PATENT DOCUMENTS

| | | |
|---|---|---|
| JP | 2004-328052 | 11/2004 |
| KR | 10-2005-0024049 | 3/2005 |

* cited by examiner

*Primary Examiner* — Chuong A. Luu
(74) *Attorney, Agent, or Firm* — Staas & Halsey LLP

(57) ABSTRACT

A sound zoom method, medium, and apparatus generating a signal in which a target sound is removed from sound signals input to a microphone-array by adjusting a null width that restricts a directivity sensitivity of the microphone array, and extracting a signal corresponding to the target sound from the sound signals by using the generated signal. Thus, a sound located at a predetermined position away from the microphone array can be selectively obtained so that a target sound is efficiently obtained.

14 Claims, 7 Drawing Sheets

SOUND ZOOM METHOD, MEDIUM, AND APPARATUS

CROSS-REFERENCE TO RELATED APPLICATIONS

This application claims the benefit of Korean Patent Application No. 10-2007-0089960, filed on Sep. 5, 2007, in the Korean Intellectual Property Office, the disclosure of which is incorporated herein in its entirety by reference.

BACKGROUND

1. Field

One or more embodiments of the present invention relate to a sound zoom operation involving changing a received sound signal according to a change in the distance from a near-field location to a far-field location, and more particularly, to a method, medium, and apparatus which can implement a sound zoom engaged with a motion picture zoom operation through the use of a zoom lens control in a portable terminal apparatus, for example, such as a video camera, a digital camcorder, and a camera phone supporting the motion picture zoom function.

2. Description of the Related Art

As video cameras, digital camcorders, and camera phones capable of capturing motion pictures are becoming increasingly more common, the amount of user created content (UCC) has dramatically increased. Similarly, with the development of high speed Internet and web technologies, the number of channels conveying such UCC is also increasing. Accordingly, there is also an increased desire for digital devices capable of obtaining a motion picture with high image and sound qualities according to the various needs of a user.

With regard to conventional motion picture photographing technologies, a zoom function for photographing an object at a far-field distance is applied only to the image of the object. Even when a motion picture photographing device photographs the far-field object, in terms of sound, the background interference sound at a near-field distance to the device is merely recorded as it, resulting in the addition of a sense of being audibly present with respect to the far-field object becomes impossible. Thus, in order to be able to photograph an object along with a sense of being present with respect to the far-field object, when sound is recorded along with the zoom function when capturing an image, a technology for recording the far-field sound by excluding the near-field background interference sound would be needed. Herein, in order to avoid confusion with a motion picture zoom function for photographing an object at a far-field distance, descriptions below regarding a technology to selectively obtain sound separated a particular distance from a sound recording device will be referred to as sound zoom.

In order to selectively obtain sound located a particular distance away from a recording device, there are techniques of changing a directivity of a microphone by mechanically moving the microphone along with the motion of a zoom lens and of electronically engaging an interference sound removal rate with the motion of a zoom lens. However, the former technique merely changes a degree of the directivity to the front side of microphone so that the near-field background interference sound cannot be removed. According to the latter technique, when the signal-to-noise ratio (SNR) of a far-field sound is low, it may be highly likely that a target signal is also removed due to a misinterpreting of a far-field target sound as the interference sound. In addition, in the engagement with a zoom lens control unit, the amount of removal of interference sound performed by an interference sound removal filter can be applied only to stationary interference sounds.

SUMMARY

To overcome such above and/or other problems, one or more embodiments of the present invention provide a sound zoom method, medium, and apparatus which can differentiate a desired sound by overcoming a problem of an undesired sound, at a distance that a user does not desire, being recorded because sound cannot be selectively obtained and recorded based on distance, and/or overcome another problem of a target sound being misinterpreted as interference sounds and removed. Such a method, medium, and apparatus can overcome a limitation of interference sound canceling being applied only to stationary interference sound, unlike a motion picture zoom function capable of photographing an object according to the distance from a near-field location to a far-field location.

Additional aspects and/or advantages will be set forth in part in the description which follows and, in part, will be apparent from the description, or may be learned by practice of the invention.

According to an aspect of the present invention, a sound zoom method includes generating a signal in which a target sound is removed from sound signals input to a microphone array by adjusting a null width that restricts a directivity sensitivity of the microphone array, and extracting a signal corresponding to the target sound from the sound signals by using the generated signal.

According to another aspect of the present invention, embodiments may include a computer readable recording medium having recorded thereon a program to execute the above sound zoom method.

According to another aspect of the present invention, a sound zoom apparatus includes a null width adjustment unit generating a signal in which a target sound is removed from sound signals input to a microphone array by adjusting a null width that restricts a directivity sensitivity of the microphone array, and a signal extraction unit extracting a signal corresponding to the target sound from the sound signals by using the generated signal.

According to one ore more embodiments of the present invention, like the motion picture zoom function capable of photographing an object according to the distance from a near distance to a far distance, sound may be selectively obtained according to the distance by interpreting sound located at a distance that a user does not desire as interference sound and removing that sound, in sound recording. In addition, a target sound may be efficiently obtained by adjusting a null width of a microphone array. Furthermore, in removing interference sound, by using a stationary interference sound removing technology varying according to the time, interference sound may be removed in an environment in which the characteristic of a signal varies in real time.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF EMBODIMENTS

Figure 1A:
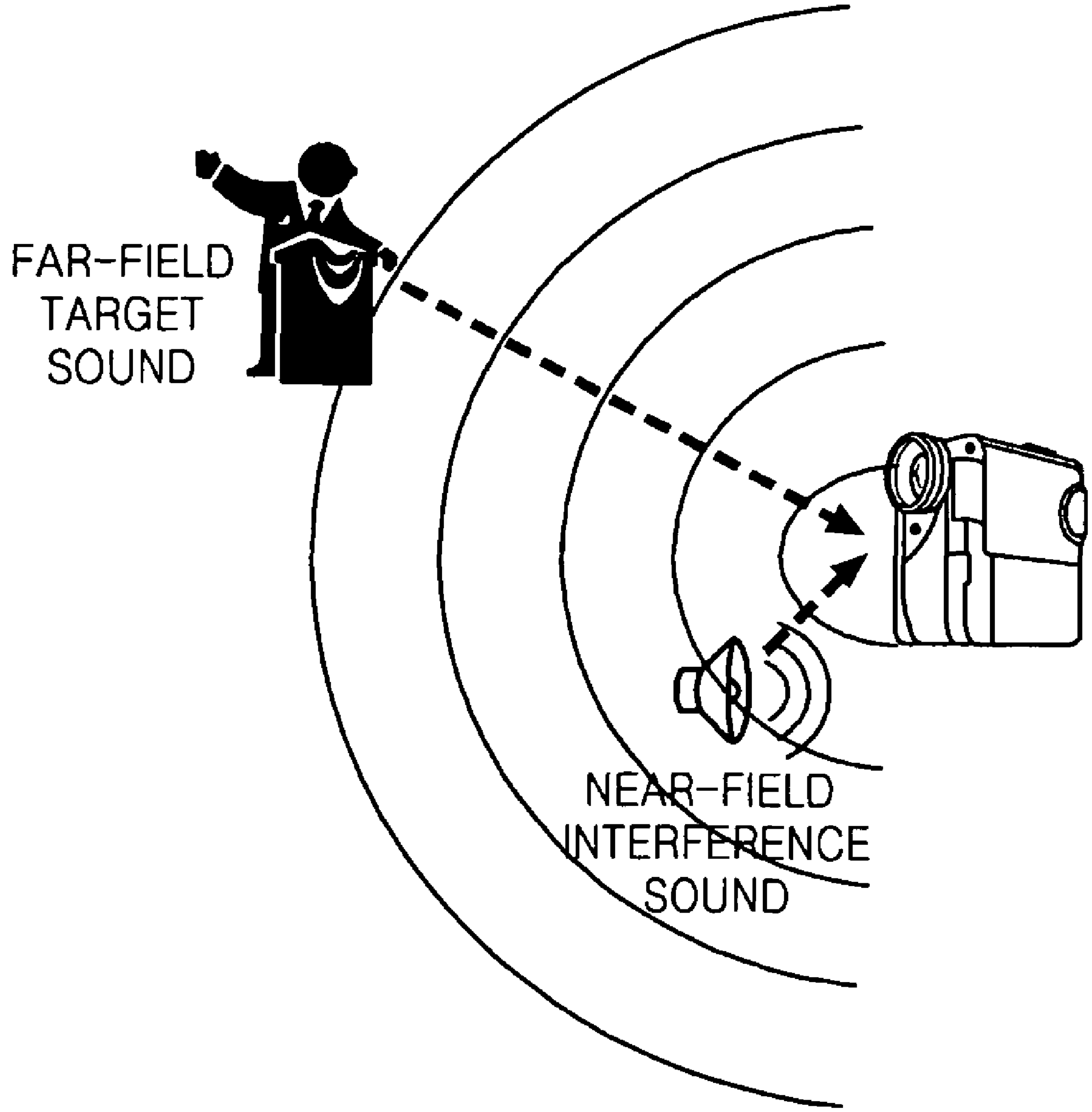
FIGS. 1A and 1B respectively illustrate environments of a desired far-field target sound with near-field interference sound and a desired near-field target sound with far-field interference sound.

Reference will now be made in detail to embodiments, examples of which are illustrated in the accompanying drawings, wherein like reference numerals refer to like elements throughout. In this regard, embodiments of the present invention may be embodied in many different forms and should not be construed as being limited to embodiments set forth herein. Accordingly, embodiments are merely described below, by referring to the figures, to explain aspects of the present invention.

In general, directivity signifies a degree of direction for sound devices, such as a microphone or a speaker, indicating a better sensitivity with respect to sound in a particular direction. The directivity has a different sensitivity according to the direction in which a microphone is facing. The width of a directivity pattern showing the directivity characteristic is referred to as a directivity width. In contrast, the width of a portion where the sensitivity in the directivity pattern is very low, because the directivity is limited, is referred to as a null width. The directivity width and the null width have a variety of adjustment parameters. The directivity width and the null width, which are sensitivities to a target sound for a microphone, for example, can be adjusted by adjusting these parameters.

Accordingly, according to one or more embodiments of the present invention, in the adjustments of the directivity width and the null width, it is relatively easier to adjust the null width than the directivity width. That is, it has been found that when a target signal is controlled by adjusting the null width, a better effect is produced than by the adjustment of the directivity width. Thus, according to one or more embodiments, there is a desire to implement a sound zoom function according to the distance by engaging with the zoom function of motion picture photographing by using the null width adjustment rather than by using the directivity width adjustment.

Figure 1B:
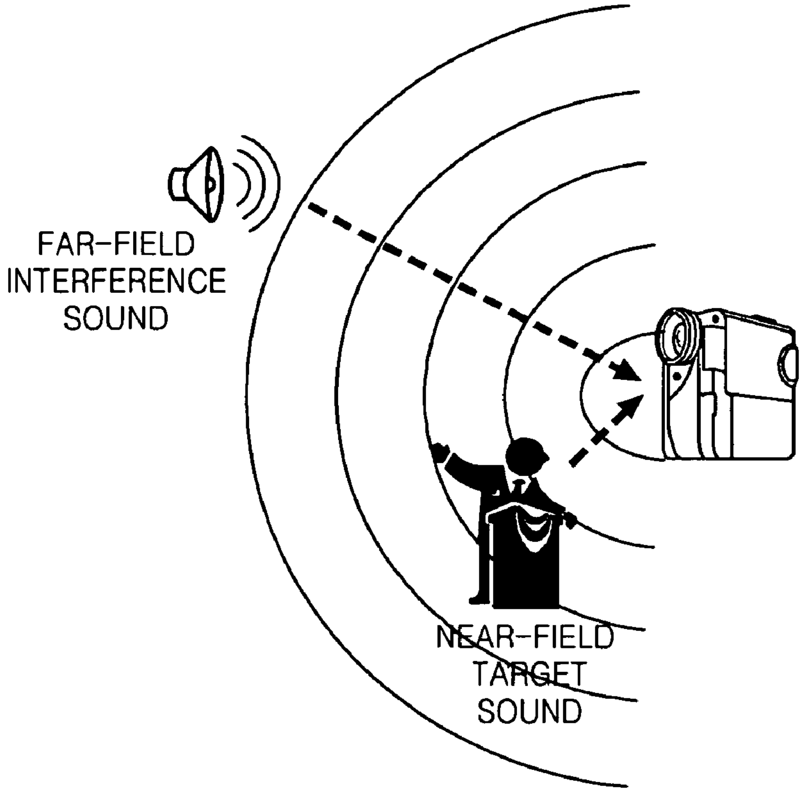
Figure 1C:
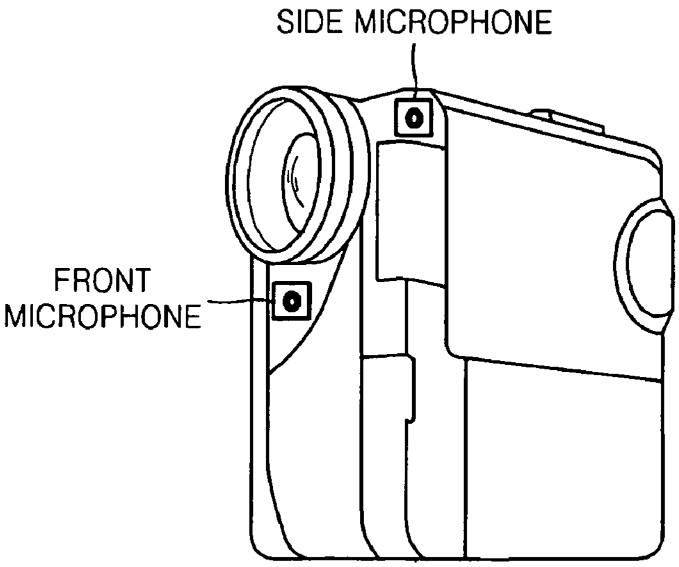
FIG. 1C illustrates a digital camcorder with example microphones for a sound zoom function, according to an embodiment of the present invention.

FIGS. 1A and 1B respectively illustrate different potential environments. In FIG. 1A, it is assumed that a digital camcorder device recording sound is placed at the illustrated center, a target sound is located at a far-field distance, and an interference noise is located at a near-field distance. In contrast, in FIG. 1B, the target sound is located at a near-field distance and the interference noise is located at a far-field distance with respect to the digital camcorder. In FIGS. 1A and 1B, the illustrated digital camcorder device is equipped with two microphones. That is, as shown in FIG. 1C, to implement a sound zoom function according to an embodiment, two microphones, e.g., a front microphone and a side microphone, are installed in the digital camcorder device for capturing and recording sounds. As illustrated, the example microphones are arranged to record both a front sound and a lateral sound, with respect to a zoom lens of the digital camcorder, for example.

Here, in an embodiment, the zoom lens of the digital camcorder device of FIG. 1A is operated in a tele-view mode to photograph an object at a far-field distance. In order to cope with the photographing of the far-field object with respective sound, the microphones of the digital camera may desirably be able to record the far-field target sound while removing near-field interference noise. In contrast, in the environment of FIG. 1B, the zoom lens of the digital camcorder device is operated in a wide-view mode to photograph an object at a near-field distance. In order to cope with the photographing of the near-field object with respective sound, the microphones of the digital camera may desirably be able to record the near-field target sound while removing far-field interference noise.

Figure 2:
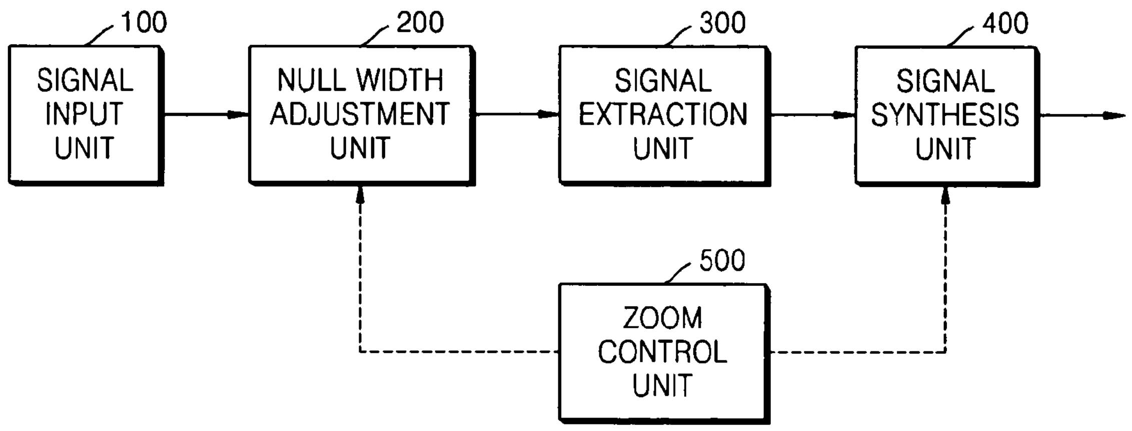
FIG. 2 illustrates a sound zoom apparatus, according to an embodiment of the present invention.

FIG. 2 illustrates a sound zoom apparatus, according to an embodiment of the present invention. Herein, the term apparatus should be considered synonymous with the term system, and not limited to a single enclosure or all described elements embodied in single respective enclosures in all embodiments, but rather, depending on embodiment, is open to being embodied together or separately in differing enclosures and/or locations through differing elements, e.g., a respective apparatus/system could be a single processing element or implemented through a distributed system, noting that additional and alternative embodiments are equally available.

Referring to FIG. 2, the sound zoom apparatus, according to an embodiment, may include a signal input unit 100, a null width adjustment unit 200, a signal extraction unit 300, a signal synthesis unit 400, and a zoom control unit 500, for example.

The signal input unit 100 may receive signals of each of various sounds around an apparatus, such as the apparatus performing the sound zoom function. Here, in an embodiment, the signal input unit 100 can be formed of a microphone array to easily process a target sound signal after receiving the sound signals via a plurality of microphones. For example, the microphone array can be an array with omni-directional microphones having the same directivity characteristic in all directions or an array with heterogeneous microphones with directivity and non-directivity characteristics. In this and the following embodiments, solely for simplification of explanation it will be assumed that two microphones are arranged in an apparatus with a sound zoom function, similar to that of the embodiment of FIG. 1C. However, for example, since the directivity characteristic can also be controlled by implementing an array with a plurality of microphones, it should be understood that four or more microphones can also be arranged to adjust the null width of a microphone array, again noting that alternatives are equally available.

The null width adjustment unit 200 may generate a signal from which a target sound has been removed by adjusting a null width that restricts a directivity sensitivity with respect to a sound signal input to the signal input unit 100. That is, in an embodiment, when a zoom lens is operated to photograph a far-field object, a sound zoom control signal may accordingly restrict the directivity sensitivity to a near-field sound so that a far-field sound can be recorded. In contrast, when the zoom lens is operated to photograph a near-field object, a sound zoom control signal may accordingly restrict the directivity sensitivity to a far-field sound so that a near-field sound can be recorded. However, in an embodiment, in the recording of a near-field sound, the directivity sensitivity to the far-field sound may be restricted not through the adjustment of null width but by considering the sounds input through the microphone array as the near-field sound. This is because in such an embodiment the level of the near-field sound is generally greater than that of the far-field sound and it may be acceptable to regard the input sound as the near-field sound and not process the input sound.

The signal extraction unit 300 may extract a signal corresponding to the target sound by removing signals other than the target sound from the sound signals input to the microphone array, e.g., based on the signal generated by the null width adjustment unit 200. In detail, in such an embodiment, when a signal from which the target sound has been removed is generated by the null width adjustment unit 200, the signal extraction unit 300 estimates the generated signal as noise. Then, the signal extraction unit 300 may remove the signal estimated as noise from the sound signals input to the signal input unit 100 so as to extract a signal relating to the target sound. Since the sound signals input to the signal input unit 100 include sounds around the corresponding sound zoom apparatus in all directions, including the target sound, a signal relating to the target sound can be obtained by removing noise from these sound signals.

Accordingly, in an embodiment, the signal synthesis unit 400 may synthesize an output signal according to a zoom control signal of the zoom control unit 500, for example, based on the target sound signal extracted by the signal extraction unit 360 and a residual signal where the target sound is not included. Here, when the far-field sound is to be obtained, the signal extraction unit 300 may consider the far-field sound and the near-field sound as the target sound and the residual signal, respectively, and output both sounds, and the signal synthesis unit 400 may combine both signals according to the zoom control signal to synthesize a final output signal. For example, when the far-field sound is to be obtained as described above, the percentage of the target sound signal to be included in the synthesized output signal may be about 90% and the percentage of the residual signal to be included in the synthesized output signal may be about 10%. Such synthesis percentages can vary according to the distance between the target sound and the sound zoom apparatus and can be set based on the zoom control signal, for example, as output from the zoom control unit 500. Although the signal extraction unit 300 may extract a target sound signal desired by a user, the target sound signal may be more accurately synthesized by the signal synthesis unit 400 according to the zoom control signal, according to an embodiment of the present invention.

In such an embodiment, the zoom control unit 500 may, thus, control the obtaining of a signal relating to the target sound located a particular distance from the sound zoom apparatus to implement sound zoom and transmit a zoom control signal relating to the target sound to the null width adjustment unit 200 and the signal synthesis unit 400. The zoom control signal may therefore enable the obtaining of sound by reflecting information about the distance to where the target sound or the object to be photographed is located. The zoom control unit 500 can be set to be engaged along with control of the zoom lens for photographing and can independently transmit a control signal by reflecting the information about the distance to where the sound is located only for the obtaining of sound, for example. In the former case, when the zoom lens is operated to photograph a far-field object, the sound zoom may be controlled to record a far-field sound. In contrast, when the zoom lens is operated to photograph a near-field object, the sound zoom may be controlled to record a near-field sound.

Figure 3:
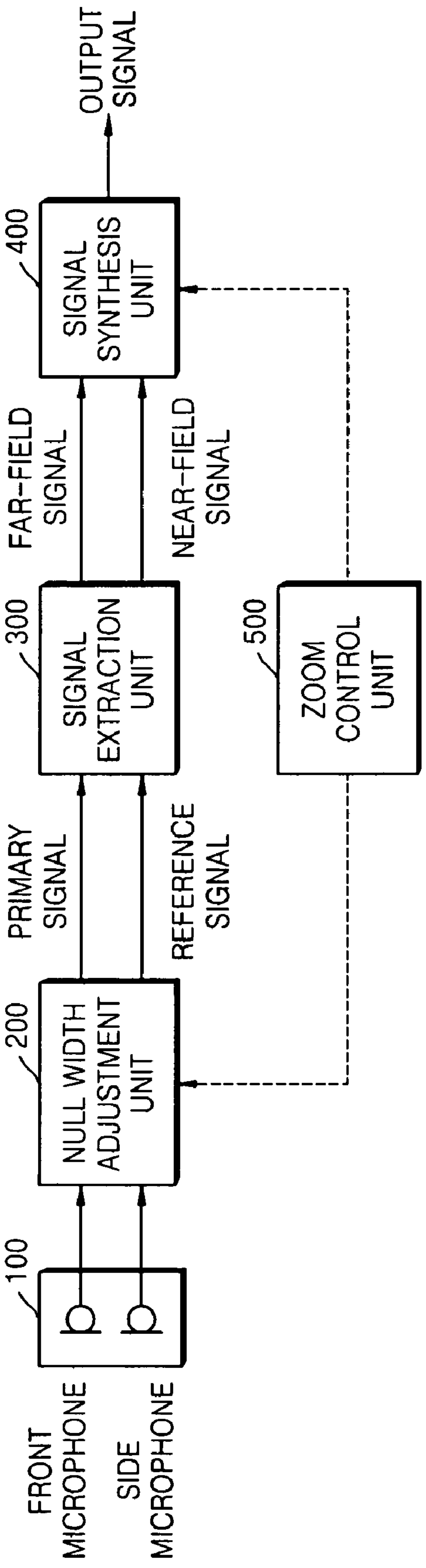
FIG. 3 illustrates a sound zoom apparatus, such as that of FIG. 2, with added input/output (I/O) signals for each element, according to an embodiment of the present invention.

FIG. 3 illustrates a sound zoom apparatus, such as the sound zoom apparatus of FIG. 2, in which input/output (I/O) signals are added to each element. Referring to FIG. 3, an example front microphone and an example side microphone may represent a microphone array corresponding to the signal input unit of FIG. 2, for example. Here, although a first-order differential microphone structure formed of only two microphones is discussed with reference to FIG. 3, it is also possible to use a second-order differential microphone structure, such a structure including four microphones, and processing an input signal using two example pairs each having two microphones or a higher order differential microphone structure including a larger number of microphones.

When the structure of FIG. 3 is described with respect to the I/O signals, the null width adjustment unit 200 may receive signals input through/from two microphones and output two types of signals, which respectively include a reference signal from which a target sound has been removed using a beam-forming algorithm and a primary signal including both background noise and the target sound, to the signal extraction unit 300. In general, the microphone array formed of two or more microphones, for example, functions as a filter capable of spatially reducing noise when the directions of a desired target signal and a noise signal are different from each other, by improving an amplitude of received signals by giving an appropriate weight to each of the received signals in the microphone array so as to receive a target signal mixed with background noise at a high sensitivity. This sort of spatial filter should be referred to as beam forming.

The signal extraction unit 300 may, thus, extract a far-field signal relating to a far-field sound and a near-field signal relating to a near-field sound by using a noise removal technology, such as that described above with reference to FIG. 2, for example. The signal synthesis unit 400 may further synthesize the two example signals received from the signal extraction unit and generate an output signal.

Figure 4:
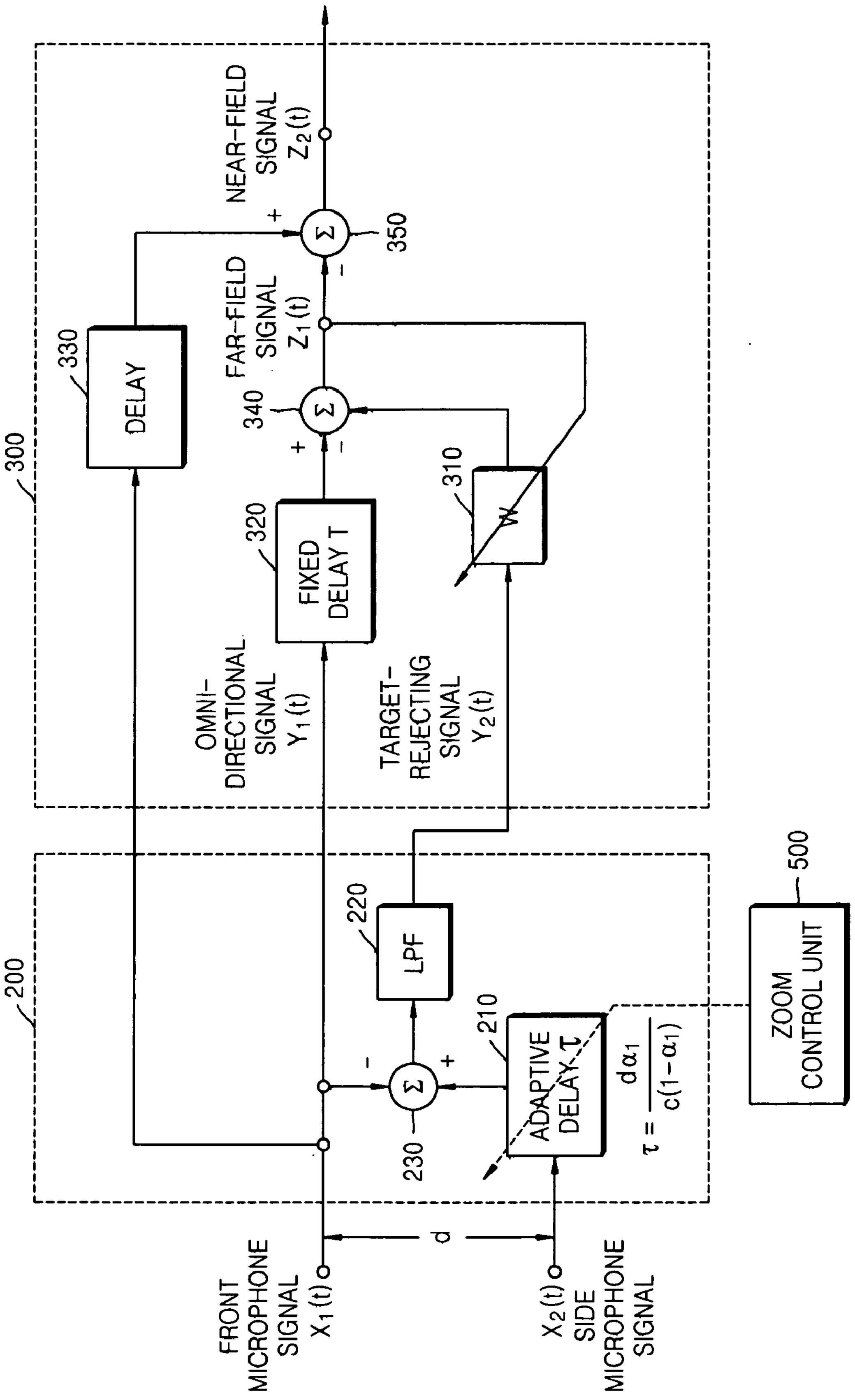
FIG. 4 illustrates a null width adjustment unit and a signal extraction unit engaged with a zoom control unit, such as in the sound zoom apparatus of FIG. 2, according to an embodiment of the present invention.

FIG. 4 illustrates a null width adjustment unit 200 and a signal extraction unit 300, such as that of FIG. 2, which may also be engaged with the zoom control unit in the sound zoom apparatus of FIG. 2.

In an embodiment, a first-order differential microphone structure, through which directivity is implemented, may be formed of two non-directivity microphones, e.g., the front and side microphones, as illustrated in FIG. 4. Adjustment parameters that can control the null width of the microphone array may include the distance between the microphones forming the microphone array and a delay of the signals input to the microphone array. As an example, in regard to the adjustment parameters, an embodiment in which adjusting of the null width of the target sound through adaptive delay adjustment will be described in greater detail below.

In order to amplify or extract the target signal from different directional noise, a phase difference between an array pattern and the signals input to the microphones are desirably obtained. In an embodiment, in the null width adjustment unit 200 of FIG. 4, a delay-and-subtract algorithm is used as the beam-forming algorithm which is described below.

The null width adjustment unit 200 of FIG. 4 may include a low pass filter (LPF) 220 and a subtractor 230, for example. An example directivity pattern of a sound signal input from the differential microphone structure to the null width adjustment unit 200 can be represented as follows. When the distance between the microphones is d, an acoustic pressure field considering the wavelength and incident angle when a front microphone signal X1(t) and a side microphone signal X2(t) may be input as expressed by be below Equation 1, for example.

$$\begin{aligned} E_1(w,\theta) &= \|P_0 e^{-j(kd\cos\theta)}(1-e^{-j(w\tau-kd\cos\theta)})\| \\ &\approx P_0 w(\tau - d\cos\theta/c) \\ &= \underbrace{P_0 w(\tau+d/c)}_{\substack{\text{First-order}\\ \text{differentiator response}}} \underbrace{\left(\frac{\tau}{\tau+d/c} - \frac{d\cos\theta/c}{\tau+d/c}\right)}_{\text{Array directional response}} \\ &\because kd \ll \pi,\ w\tau \ll \pi \end{aligned} \quad \text{Equation 1}$$

Here, a narrowband assumption that the distance d between two microphones is smaller than half the wavelength of sound may be used. This narrowband assumption is for assuming that spatial aliasing is not generated according to the arrangement of a microphone array, and to exclude a case of the distortion of sound. In Equation 1, c denotes 340 m/sec, which is the speed of a sound wave in the air, and P0, w, τ, and θ denote, respectively, the amplitude, the angular frequency, the adaptive delay, and the incident angle of a sound signal input to the microphone. k is a wave number and can be expressed so that k=w/c.

Referring again to Equation 1, the acoustic pressure field of the sound signal input to the microphone array may be expressed by a formula for variables w and θ. The acoustic pressure field is expressed by a multiplication of the first-order differential response and the array directional response as shown in the listed second equation of Equation 1. The first-order differential response is a term affected by the frequency w and can be easily removed by the low pass filter. That is, the first-order differential response of Equation 1 can be removed by the frequency response of 1/w in the low pass filter. The low pass filter is shown as the LPF 220 of FIG. 4 and guides the acoustic pressure field to have linearity with the directivity response by restricting the change in the frequency in Equation 1.

The sound signal filtered by the low pass filter is independent of the frequency in a low band in this narrowband assumption. In this case, the directional sensitivity that can be referred to as a directional response of the microphone array can be defined by a combination of particular parameters such as the adaptive delay τ or the interface d between the microphones, as shown in the below Equation 3. Referring to the below example Equations 2 and 3, it can be seen that the directional sensitivity of the microphone array can be changed by varying the adaptive delay τ or the interface d between the microphones.

$$E_{N_1}(\theta)=\alpha_1-(1-\alpha_1)\cos\theta \quad \text{Equation 2}$$

In Equation 2, the variable a can be given by the below Equation 3, for example.

$$\alpha_1 = \frac{\tau}{\tau+d/c} \quad \text{Equation 3}$$

An adaptive delay 210, the LPF 220, and the subtractor 230 of the null width adjustment unit 200 can restrict the directivity sensitivity of the microphone array to the target sound located at a predetermined distance in engagement with the zoom control signal of the zoom control unit 500, for example, by using the characteristic of the sound signal having the acoustic pressure field of the example Equation 1 input to the microphones array. That is, as the adaptive delay 210 delays the side microphone signal X2(t) relating to the sound signal having the acoustic pressure field of Equation 1 input to the microphone array by the adaptive delay τ corresponding to the zoom control signal of the zoom control unit 500, the subtractor 230 may subtract the front microphone signal X1(t) from the side microphone signal X2(t), delayed by the adaptive delay 210, and as the LPF 220 low pass filters a result of the subtraction of the subtractor 230, the first-order differential response including the amplitude component and the frequency component, which vary according to the characteristic of the sound signal, can be fixed.

As described above, when the first-order differential response including the amplitude component and the frequency component, which vary according to the characteristic of the sound signal, is fixed, since the example Equation 1 has linearity determined by the adaptive delay τ and the distance d between the microphones, Equation 1, that is, the acoustic pressure field, in which the target sound signal located at a predetermined distance is restricted, can be formed by adjusting the adaptive delay τ and the distance d between the microphones. In general, since the distance d between the microphones may be a fixed value, the adaptive delay τ can be adjusted according to the sound zoom signal. That is, the null width adjustment unit 200 can restrict the directivity sensitivity of the microphone array to the target sound located a predetermined distance from the sound zoom apparatus by the operations of the adaptive delay 210, the LPF 220, and the subtractor 230, for example.

U.S. Pat. No. 6,931,138 entitled "Zoom Microphone Device" (Takashi Kawamura) discusses a device that receives only a front sound and is engaged with a zoom lens control unit when a far-field object is photographed by using a zoom lens by adjusting the directivity characteristic. In this example system, noise removal function is implemented as a Wiener filter in a frequency range and a suppression ratio and flooring constants are adjusted in engagement with the zoom. In order to reduce the influence of near-field background noise during far-field photographing, noise suppression is increased and the volume/amplitude of far-field sound is increased. However, according to this technique, when the signal-to-noise ratio of the far-field sound is low, there is a possibility that the far-field sound signal may be misinterpreted as noise and removed, thus highlighting only the near-field sound. The signal-to-noise ratio signifies a degree of noise when compared to a nominal level in a normal operation state. That is, in such a technique, near-field sound cannot be removed during far-field photographing. Only a time-invariable stationary noise can be removed due to the noise characteristic of a Wiener filter. Thus, the performance of noise canceling becomes degraded with respect to a non-stationary signal in real life, such as music or babble noise. This is because this technique can be applied only to the removal of noise in a stationary state as the noise removal amount of the Wiener filter is engaged with only the zoom lens control unit.

Unlike this technique, a signal extraction unit 300 of an embodiment of the present embodiment can use an adaptive noise canceling (ANC) technology, as a noise canceling technique, to extract a target sound. In FIG. 4, a FIR (finite impulse response) filter W 310 is used as the ANC. Here, in this example, the ANC is a sort of feedback system performing a type of adaptive signal processing that allows a signal resulting from filtering of the original signal to approach a target signal by reflecting the resultant signal in a filter by using an adaptive algorithm that minimizes an error when the environment varies according to time and the target signal is not well known. The ANC uses the adaptive signal process to cancel the noise by using the signal characteristic.

In this embodiment, the ANC may generate the learning rule of the FIR filter 310 by continuously performing feedback of a change according to the time in the non-stationary state in which the signal characteristic changes in real time, and remove the time-varying background noise generated in real life by using the learning rule of the FIR filter. That is, the ANC may automatically model a transfer function from a noise generation source to the microphone by using a different statistic characteristic between the target sound and the background noise. The FIR filter can learn by using an adaptive learning technology in a general LMS (least mean square) method, an NLMS (normalized mean square) method, or an RMS (recursive mean square) method, for example. As the ANC and the learning methods of the filter should be easily understood by those of ordinary skill in the art to which the present invention pertains, further detailed descriptions thereof will be omitted herein.

The operation of the ANC may be described with reference to the below Equations 4-6, for example.

$$X_1(z)=S_{Far}(z)H_{11}(z)+S_{Near}(z)H_{21}(z)$$

$$X2(z)=S\text{Far}(z)H12(z)+S\text{Near}(z)H22(z) \quad \text{Equation 4}$$

Here, H(z) is a room impulse response, which is a transfer function in a space between the original signal and the microphone, and X1(*z*) and X2(*z*) are input signals initially input to the microphone array. In regard to each input signal, in an embodiment, it can be assumed that the far-field sound signal SFar(z) and the near-field sound signal SNear(z) are formed in a space by a linear filter combination.

In this example, in FIG. 4, the sound signal X1(*t*) directly input to the front microphone becomes an output signal Y1(*t*) (omni-directional signal) of the null width adjustment unit 200 while the sound signal X2(*t*) input to the side microphone becomes an output signal Y2(*t*) (target-rejecting signal) where only the target sound is removed. The output signals Y1(*t*) and Y2(*t*) of the null width adjustment unit 200 may further be summarized by the below Equation 5, for example, through reference to Equation 4.

$$Y_1(z)=S_{Far}(z)H_{11}(z)+S_{Near}(z)H_{21}(z)$$

$$2(z)=S\text{Near}(z)H22(z) \quad \text{Equation 5}$$

Referring back to FIG. 4, the signal extraction unit 300 may include the FIR filter 310, a fixed delay 320, a delay 330, and two subtractors 340 and 350. The FIR filter 310 may estimate the signal Y2(*t*) from which the target sound is removed by the null width adjustment unit 200 as noise, the fixed delay 320 may compensate for a latency of the first-order differential microphone, and the subtractor 340 may subtract the noise signal estimated by the FIR filter 310 from the sound signal Y1(*t*) delayed by the fixed delay 320 in order to extract a sound signal Z1(*t*) corresponding to the target sound. Here, the ANC feeds back the sound signal Z1(*t*) that is a result of the extraction to the FIR filter 310 to make the sound signal Z1(*t*) approach the target sound. Thus, the ANC can effectively perform the cancellation of noise in a non-stationary state in which the signal characteristic varies according to time. The fixed delay 320 that compensates for the computational latency in the first-order differential microphone, is introduced to use a casual FIR filter in the ANC structure, and is desirably preset to fit the computation capacity of a system.

Referring to the above Equation 5, the above process may be further described by the below Equation 6, for example.

$$\begin{aligned} Z_1(z) &= Y_1(z) - WY_2(z) \\ &= (S_{Far}(z)H_{11}(z) + S_{Near}(z)H_{21}(z)) - W(z)(S_{Near}(z)H_{22}(z)) \\ &= S_{Far}(z)H_{11}(z) + \underbrace{S_{Near}(z)(H_{21}(z) - W(z)H_{22}(z))}_{\text{Can be deleted by FIR filter}} \end{aligned} \quad \text{Equation 6}$$

Equation 6 shows the subtraction of the sound signal Y2(*t*) which passed the sound signal Y1(*t*) and the FIR filter W 310. In Equation 6, when the FIR filter W 310 is adjusted using the example adaptive learning technology, that is, the value of (H21(z)−W(z)H22(z)) is set to 0, the signal of a near-field sound can be removed. When the far-field sound is obtained, the near-field background interference sound may thus be estimated as noise so as to be removed.

Finally, the sound signal X1(*t*) input to the front microphone may be filtered by the delay filter 330 and then the signal Z1(*t*) corresponding to the target sound subtracted from the filtered sound signal X1(*t*) by the subtraction unit 350 so that the signal Z2(*t*) from which the target sound is removed can be extracted. Referring to the above Equation 6, the process may be further described with reference to the below Equation 7, for example.

$$\begin{aligned} Z_2(z) &= Y_1(z) - Z_1(z) \\ &= (S_{Far}(z)H_{11}(z) + S_{Near}(z)H_{21}(z)) - (S_{Far}(z)H_{11}(z)) \\ &= S_{Near}(z)H_{21}(z) \end{aligned} \quad \text{Equation 7}$$

As described above, in the embodiment of FIG. 4, a signal, from which the target sound is removed, is generated by adjusting the pattern of a null width restricting the directivity sensitivity, instead of by directly adjusting the directivity with respect to the target sound signal. Next, after the signal, from which the target sound is removed by using a noise cancellation technology, is estimated as noise, a signal corresponding to the target sound may be generated in a subtracting of the estimated noise from the whole signal.

As described with reference to FIG. 2, although the target sound signal desired by a user may already be extracted by the signal extraction unit through the above process, in order to more accurately synthesize the target sound signal according to the zoom control signal, the signal synthesis process is further described below in the following embodiment.

Figure 5:
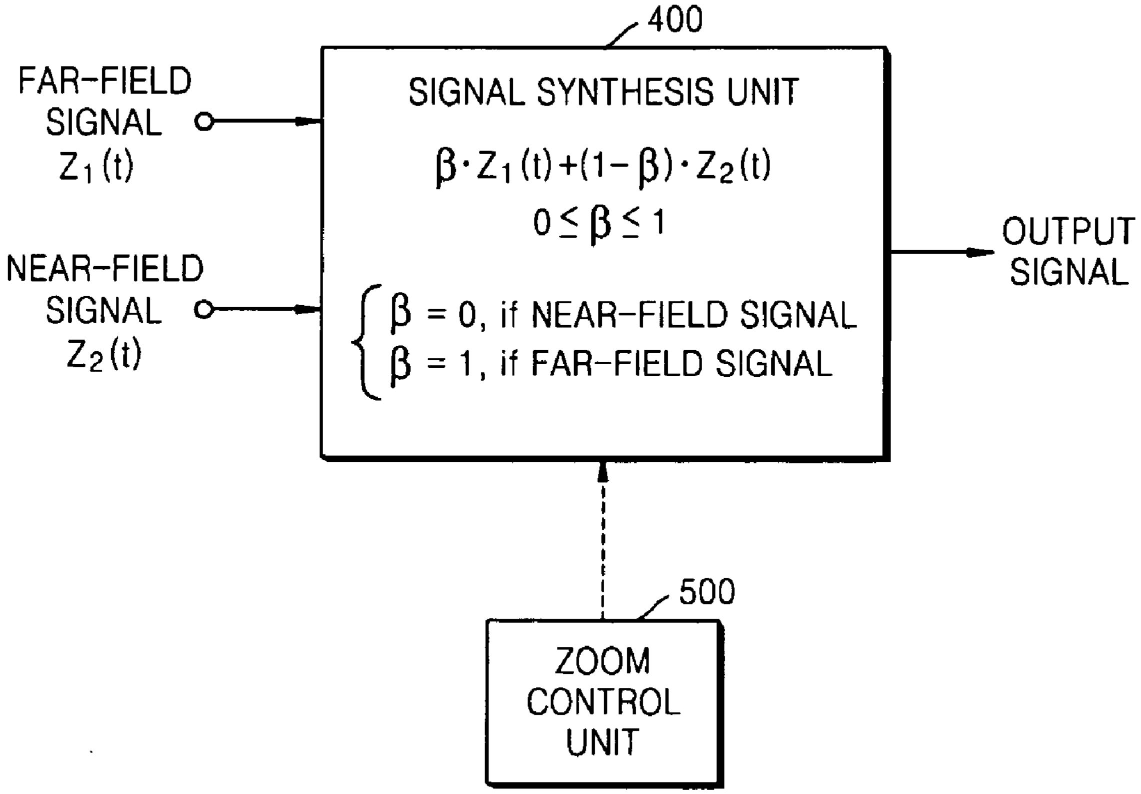
FIG. 5 illustrates a signal synthesis unit in a sound zoom apparatus, such as that of FIG. 2, according to an embodiment of the present invention.

FIG. 5 illustrates a signal synthesis unit 400, such as in the sound zoom apparatus of FIG. 2, according to an embodiment of the present invention. Referring to FIG. 5, the signal synthesis unit 400 may synthesize a final output signal according to a control signal of the zoom control unit 500, for example, based on the far-field sound signal Z1(*z*) and the near-field sound signal Z2(*z*) which are extracted from the signal extraction unit (e.g., the signal extraction unit 300 of FIG. 3). In the signal synthesis process, the far-field sound signal and the near-field sound signal may be linearly combined and an output signal synthesized by exclusively adjusting the signal strength of both signals according to a sound zoom control signal. In an embodiment, the final output signal can be further expressed according to the below Equation 8, for example.

$$\text{Output signal} = \beta \cdot Z_1(t) + (1-\beta) \cdot Z_2(t) \quad \text{Equation 8}$$

$$(0 \leq \beta \leq 1)$$

$$\begin{cases} \beta = 0, \text{ if near-field signal} \\ \beta = 1, \text{ if far-field signal} \end{cases}$$

Here, β is a variable expressing an exclusive weight relating to the combining of two sound signals and has a value between 0 to 1. That is, when the target signal is a near-field sound signal, by approximating β to 0 according to the control signal of the zoom control unit 500, most of the output signal may be formed of only the near-field sound signal Z2(*t*). In contrast, when the target signal is the far-field sound signal, most of the output signal may be formed of only the far-field sound signal Z1(*z*) by approximating β to 1.

Figure 6A:
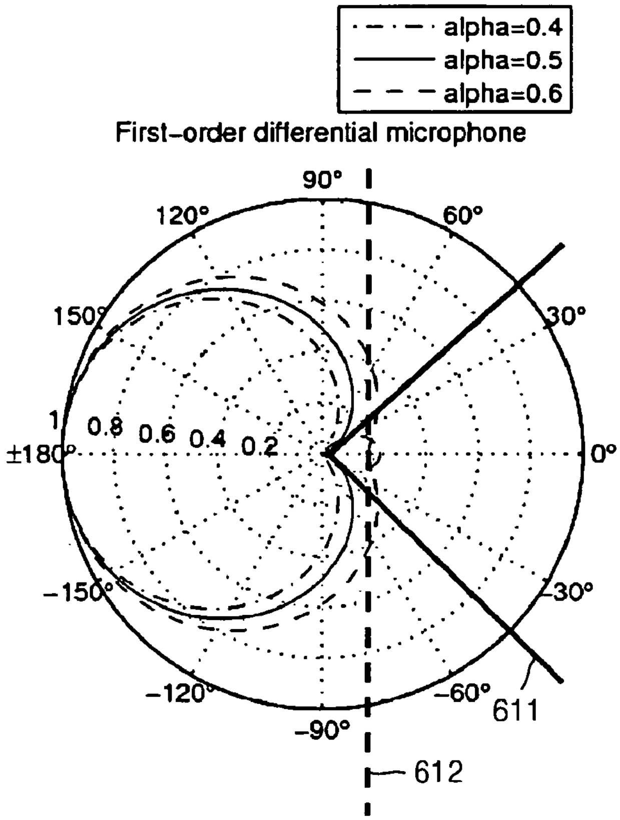
FIGS. 6A and 6B illustrate polar patterns showing a null width adjustment function according to a null width adjustment parameter, such as in the sound zoom apparatus of FIG. 2, according to embodiments of the present invention.
Figure 6B:
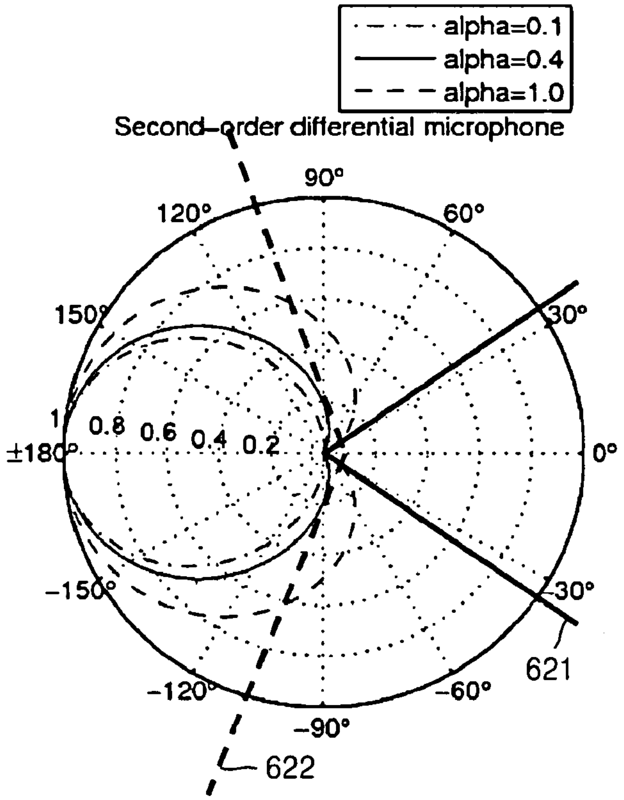

FIGS. 6A and 6B illustrate polar patterns showing a null width adjustment function according to the null width adjustment parameter, such as in the sound zoom apparatus of FIG. 2, according to embodiments of the present invention. Here, in these example illustrations, the directivity response of Equation 2 is illustrated according to the angle θ and the variable α. In general, to indicate the directivity of a sound device, the front side of a microphone may be set to a degree of "0" with respect to the microphone and the sensitivity of the microphone from 0° to 360° according to the surrounding angle of the microphone and thereby expressed in the shown polar pattern charts. Thus, FIGS. 6A and 6B respectively show that the null width control for both the first-order differential microphone structure and a second-order differential microphone structure is easily performed with a single variable α. As described with the above Equations 2 and 3, the variable α is one of the null width control factors and adjusted by being engaged with a control signal of the zoom control unit 500, for example.

In FIGS. 6A and 6B, the far-field target sound can be removed in the direction of the degree 0 in the polar pattern and the null width pattern changed according to the change of the variable α so that background noise is reduced. FIG. 6A illustrates the change in the null width in the first-order differential microphone structure, in which the null width is changed from 611 to 612 according to the change in the variable α. Further, FIG. 6B illustrates the null width change in the second-order differential microphone structure, in which the null width is changed from 621 to 622 according to the change in the variable α.

The directivity width in a round shape is indicated in a direction of 180° opposite to the null width in the direction of 0° in each polar patterns of FIGS. 6A-6B. The directivity width is also changed according to the change of the variable α. Thus, it can be seen that the change in the null width is relatively small, compared to the amount of change in the null width. That is, in FIGS. 6A-6B, the adjustment of the directivity width is not easy compared to the adjustment of the null width as described above. Accordingly, it is experimentally shown that the null width adjustment has a better effect than the directivity width adjustment.

In addition to the above described embodiments, embodiments of the present invention can also be implemented through computer readable code/instructions in/on a medium, e.g., a program on a computer readable medium, to control at least one processing element to implement any above described embodiment. The medium can correspond to any medium/media permitting the storing and/or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media such as media carrying or including carrier waves, as well as elements of the Internet, for example. Thus, the medium may be such a defined and measurable structure including or carrying a signal or information, such as a device carrying a bitstream, for example, according to embodiments of the present invention. The media may also be a distributed network, so that the computer readable code is stored/transferred and executed in a distributed fashion. Still further, as only an example, the processing element could include a processor or a computer processor, and processing elements may be distributed and/or included in a single device.

While aspects of the present invention has been particularly shown and described with reference to differing embodiments thereof, it should be understood that these exemplary embodiments should be considered in a descriptive sense only and not for purposes of limitation. Descriptions of features or aspects within each embodiment should typically be considered as available for other similar features or aspects in the remaining embodiments.

Thus, although a few embodiments have been shown and described, it would be appreciated by those skilled in the art that changes may be made in these embodiments without departing from the principles and spirit of the invention, the scope of which is defined in the claims and their equivalents.

What is claimed is:

1. A sound zoom method comprising:

generating a signal in which a target sound is removed from sound signals input to a microphone array by adjusting a null width that restricts a directivity sensitivity of the microphone array; and extracting a signal corresponding to the target sound from the sound signals by using the generated signal.

2. The method of claim 1, wherein, in the generating of a signal in which a target sound is removed from sound signals, a predetermined factor of the microphone array is adjusted according to a zoom control signal so that the null width is adjusted so as to correspond to the adjusted predetermined factor.

3. The method of claim 1, wherein the generating of a signal in which a target sound is removed from sound signals comprises:

delaying a first sound signal of the sound signals by a value corresponding to a zoom control signal;

subtracting a second sound signal of the sound signals from the first sound signal that is delayed; and generating a signal in which the target sound is removed, by allowing a result of the subtraction to be low-pass filtered.

4. The method of claim 1, wherein the extracting of a signal corresponding to the target sound comprises:

estimating the generated signal as noise; and subtracting a signal estimated as the noise from the sound signals, and in the estimating of the generated signal as noise, the sound signals in which the signal is estimated as the noise are fed back.

5. The method of claim 1, further comprising synthesizing an output signal based on the sound signal and a signal corresponding to the target sound according to a zoom control signal to obtain the target sound.

6. The method of claim 5, wherein the synthesizing of an output signal comprises:

linearly combining a signal corresponding to the target sound and a residual signal in which a signal corresponding to the target sound is removed from the sound signals; and exclusively adjusting both of the signals which are linearly combined according to the zoom control signal.

7. A non-transitory computer readable recording medium having recorded thereon a program to execute any of the sound zoom methods defined in claims 1.

8. A sound zoom apparatus comprising:

a null width adjustment unit generating a signal in which a target sound is removed from sound signals input to a microphone array by adjusting a null width that restricts a directivity sensitivity of the microphone array; and a signal extraction unit extracting a signal corresponding to the target sound from the sound signals by using the generated signal.

9. The apparatus of claim 8, wherein the null width adjustment unit adjusts a predetermined factor of the microphone array according to a zoom control signal so that the null width is adjusted so as to correspond to the adjusted predetermined factor.

10. The apparatus of claim 8, wherein the null width adjustment unit comprises:

a delay of a first sound signal of the sound signals, which is delayed by a value corresponding to a zoom control signal;

a subtractor subtracting a second sound signal of the sound signals from the first sound signal that is delayed; and a low pass filter generating a signal in which the target sound is removed, by allowing a result of the subtraction to be low-pass filtered.

11. The apparatus of claim 8, wherein the signal extraction unit comprises:

a noise filter estimating the generated signal as noise; and a subtractor subtracting a signal estimated as the noise from the sound signals, and the noise filter feeds back sound signals from which the signal estimated as the noise is subtracted.

12. The apparatus of claim 8, further comprising a signal synthesis unit synthesizing an output signal based on the sound signal and a signal corresponding to the target sound according to a zoom control signal to obtain the target sound.

13. The apparatus of claim 12, wherein the signal synthesis unit linearly combines a signal corresponding to the target sound and a residual signal in which a signal corresponding to the target sound is removed from the sound signals and exclusively adjusts both of the signals which are linearly combined according to the zoom control signal.

14. The method of claim 1, further comprising:

synthesizing an output signal by combining the extracted signal and the generated signal wherein a combining ratio of the extracted signal and the generated signal is determined according to a zoom control signal.

* * * * *

UNITED STATES PATENT AND TRADEMARK OFFICE

CERTIFICATE OF CORRECTION

PATENT NO. : 8,290,177 B2
APPLICATION NO. : 12/010087
DATED : October 16, 2012
INVENTOR(S) : So-young Jeong et al.

It is certified that error appears in the above-identified patent and that said Letters Patent is hereby corrected as shown below:

Title Page Column 2 (Abstract); Line 3; Delete "microphone-array" and insert -- microphone array --, therefor.

In the Claims:
Column 13, Line 9; In Claim 7, delete "claims" and insert -- claim --, therefor.

Signed and Sealed this
Seventh Day of May, 2013

Teresa Stanek Rea
*Acting Director of the United States Patent and Trademark Office*